(12) United States Patent
Ito et al.

(10) Patent No.: US 12,222,493 B2
(45) Date of Patent: Feb. 11, 2025

(54) OPTICAL MODULE

(71) Applicant: Sumitomo Electric Industries, Ltd., Osaka (JP)

(72) Inventors: Shinya Ito, Osaka (JP); Yohei Enya, Osaka (JP); Takashi Kyono, Osaka (JP); Hiromi Nakanishi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 656 days.

(21) Appl. No.: 17/601,709

(22) PCT Filed: Dec. 19, 2019

(86) PCT No.: PCT/JP2019/049891
§ 371 (c)(1),
(2) Date: Oct. 6, 2021

(87) PCT Pub. No.: WO2020/208871
PCT Pub. Date: Oct. 15, 2020

(65) Prior Publication Data
US 2022/0206289 A1 Jun. 30, 2022

(30) Foreign Application Priority Data
Apr. 11, 2019 (JP) .................................. 2019-075439

(51) Int. Cl.
*G02B 26/10* (2006.01)
*G02B 26/08* (2006.01)
(Continued)

(52) U.S. Cl.
CPC ....... *G02B 26/105* (2013.01); *G02B 26/0833* (2013.01); *H01S 5/022* (2013.01); *H01S 5/02315* (2021.01)

(58) Field of Classification Search
CPC .. G02B 26/105; G02B 26/0833; G02B 7/181; G02B 26/101; H01S 5/022;
(Continued)

(56) References Cited

U.S. PATENT DOCUMENTS

2008/0204839 A1* 8/2008 Murakami ........... G02B 26/085
359/199.1
2013/0094003 A1* 4/2013 Abele .................. H04N 9/3129
359/290

(Continued)

FOREIGN PATENT DOCUMENTS

JP 2014-56199 A 3/2014
JP 2014-186068 A 10/2014
(Continued)

*Primary Examiner* — Mustak Choudhury
(74) *Attorney, Agent, or Firm* — XSENSUS LLP

(57) ABSTRACT

An optical module includes a light-forming unit configured to form light, and a protective member surrounding and sealing the light-forming unit. The light-forming unit includes a laser diode, a first MEMS including a first mirror having a first reflective surface that reflects and scans light from the laser diode, the first mirror oscillating to form a first plane, and a second MEMS including a second mirror having a second reflective surface that reflects and scans light from the first mirror, the second mirror oscillating to form a second plane orthogonal to the first plane.

10 Claims, 14 Drawing Sheets

(51) Int. Cl.
*H01S 5/022* (2021.01)
*H01S 5/02315* (2021.01)

(58) Field of Classification Search
CPC .............. H01S 5/02315; H01S 5/0071; H01S 5/02212; H01S 5/02255; H01S 5/4093; H04N 5/74
See application file for complete search history.

(56) References Cited

U.S. PATENT DOCUMENTS

2014/0078473 A1* 3/2014 Kusaka .............. G02B 27/0972
353/31
2017/0207606 A1 7/2017 Nakanishi

FOREIGN PATENT DOCUMENTS

| JP | 2015-52675 A | | 3/2015 |
|---|---|---|---|
| JP | 2015052675 A | * | 3/2015 |
| JP | 2016-15415 A | | 1/2016 |
| WO | 2007/120831 A2 | | 10/2007 |

* cited by examiner

OPTICAL MODULE

CROSS-REFERENCE TO RELATED APPLICATIONS

The present application is based on PCT filing PCT/JP2019/049891, filed Dec. 19, 2019, which claims priority to Japanese Patent Application No. 2019-075439, filed on Apr. 11, 2019, the entire contents of each are incorporated herein by reference.

TECHNICAL FIELD

The present disclosure relates to an optical module.

BACKGROUND ART

Optical modules including a light-emitting unit that emits light from a semiconductor light-emitting element and a scanning unit that scans the light from the light-emitting unit are known (see, for example, Patent Literatures 1 to 3). Such an optical module can draw images such as characters and figures by two-dimensionally scanning the light from the light-emitting unit along a desired path.

PATENT LITERATURE

Patent Literature 1: Japanese Patent Application Laid-Open No. 2014-186068
Patent Literature 2: Japanese Patent Application Laid-Open No. 2014-56199
Patent Literature 3: International Patent Publication No. WO 2007/120831

SUMMARY OF INVENTION

An optical module according to the present disclosure includes a light-forming unit configured to form light, and a protective member surrounding and sealing the light-forming unit. The light-forming unit includes a laser diode, a first micro electro mechanical system (MEMS) including a first mirror having a first reflective surface that reflects and scans light from the laser diode, the first mirror oscillating to form a first plane with a trajectory of a first normal which is a normal at a center point of the first reflective surface, and a second MEMS including a second mirror having a second reflective surface that reflects and scans light from the first mirror, the second mirror oscillating to form a second plane orthogonal to the first plane with a trajectory of a second normal which is a normal at a center point of the second reflective surface.

DESCRIPTION OF EMBODIMENTS

Figure 1:
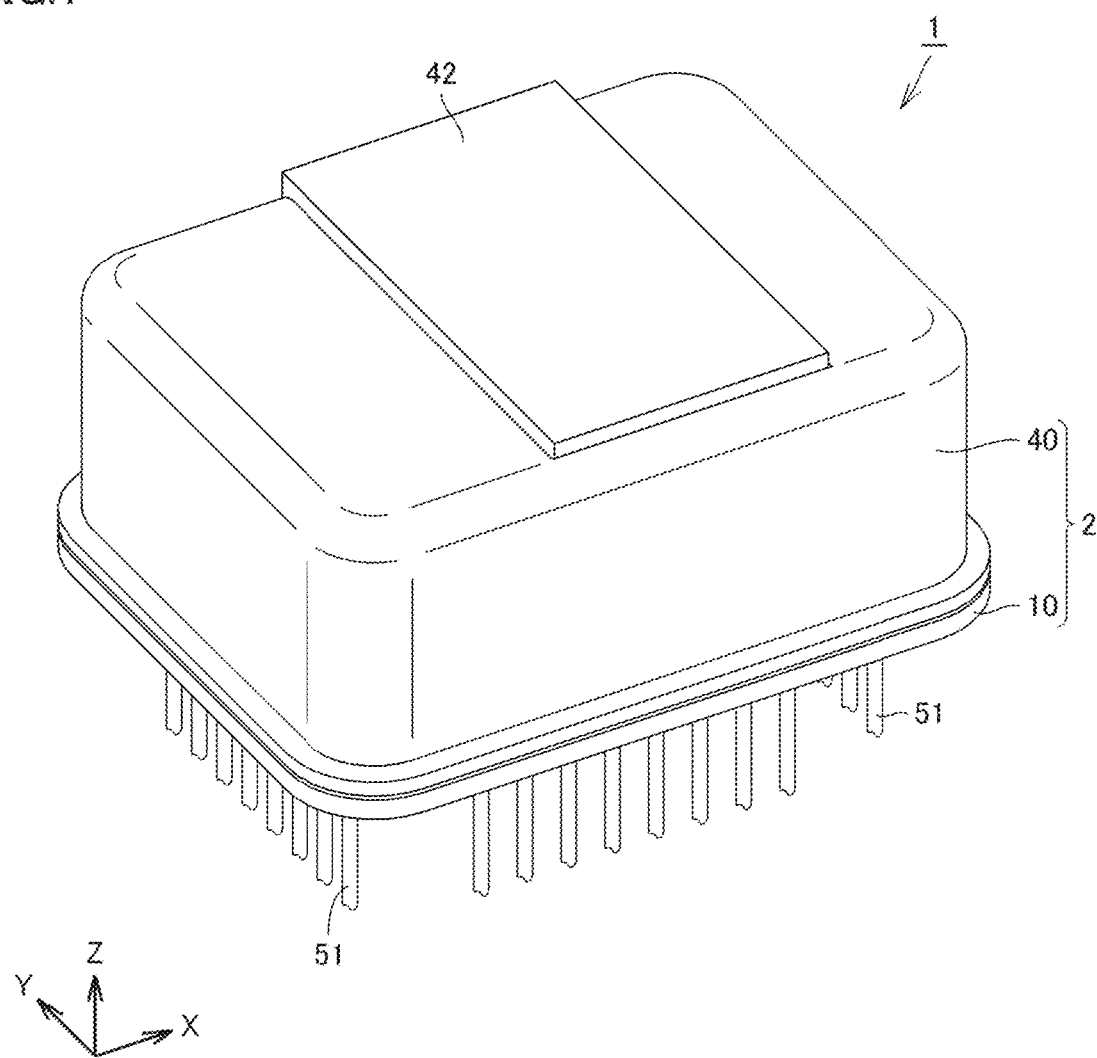
FIG. 1 is a schematic perspective view showing the structure of an optical module in Embodiment 1.

Problems to be Solved by the Present Disclosure

In the optical module described above, reduction in size is required. The scanning unit includes a mirror that oscillates to scan the light from the light-emitting unit. When the light from the light-emitting unit is scanned two-dimensionally using a single mirror, the oscillation in the horizontal direction may cause propagation of the oscillation in the vertical direction, for example. In such a case, the mirror is difficult to control, hindering proper image drawing.

In view of the foregoing, one of the objects is to provide an optical module that can facilitate the control of mirrors, while realizing reduction in size, and enable two-dimensional drawing.

Advantageous Effects of the Present Disclosure

The present disclosure is able to provide an optical module that is capable of easy control of mirrors, while realizing reduction in size, and is capable of two-dimensional drawing.

Description of Embodiments of the Present Disclosure

Embodiments of the present disclosure will be listed and described first. An optical module of the present disclosure includes a light-forming unit configured to form light, and a protective member surrounding and sealing the light-forming unit. The light-forming unit includes a laser diode, a first MEMS including a first mirror having a first reflective surface that reflects and scans light from the laser diode, the first mirror oscillating to form a first plane with a trajectory of a first normal which is a normal at a center point of the first reflective surface, and a second MEMS including a second mirror having a second reflective surface that reflects and scans light from the first mirror, the second mirror oscillating to form a second plane orthogonal to the first plane with a trajectory of a second normal which is a normal at a center point of the second reflective surface.

In the optical module of the present disclosure, the laser diode, the first MEMS, and the second MEMS are sealed by the protective member. The optical module can thus be reduced in size as compared to an optical module having a laser diode, a first MEMS, and a second MEMS individually sealed in a package and combined together. Further, the optical module of the present disclosure includes the first MEMS including the first mirror and the second MEMS including the second mirror. The first mirror oscillates to form the first plane with the trajectory of the first normal. The second mirror oscillates to form the second plane orthogonal to the first plane with the trajectory of the second normal. This enables two-dimensional scanning of light with the first and second mirrors. Since the scanning of light in two directions is performed by separate mirrors, the propagation of oscillation in one direction to another direction as in the case of realizing the two-dimensional scanning of light with a single mirror can be suppressed. As such, the optical module of the present disclosure is capable of easy control of the mirrors, while realizing reduction in size, and is capable of two-dimensional drawing.

It should be noted that in the present disclosure, the center points in the first and second reflective surfaces refer to midpoints of oscillation axes of the first and second mirrors, respectively, in projected images when the oscillation axes are projected, relative to the first and second reflective surfaces, in the directions perpendicular to the planes including the outer edges of the first and second reflective surfaces.

In the above optical module, the light-forming unit may further include a base member that includes an electronic temperature control module. The first MEMS and the second MEMS may be disposed on the base member. In the first and second MEMS, the first and second mirrors may vary in deflection angle depending on the temperatures. The electronic temperature control module included in the base member can adjust the temperatures of the first and second MEMS to an appropriate range. This leads to improved operational stabilities of the first and second MEMS against temperature changes.

In the above optical module, the light-forming unit may further include a plurality of laser diodes and a filter that multiplexes the light emitted from the plurality of laser diodes. With such a configuration, it is possible to multiplex the light emitted from the plurality of laser diodes with the filter and emit the multiplexed light.

In the above optical module, the light-forming unit may further include a plurality of filters that multiplex the light emitted from the plurality of laser diodes. The plurality of laser diodes may include a first laser diode that emits first light, a second laser diode that emits second light, and a third laser diode that emits third light. The plurality of filters may include a first member that multiplexes the first light emitted from the first laser diode with the second light emitted from the second laser diode, and a second member that multiplexes the first light and the second light multiplexed by the first member with the third light emitted from the third laser diode. Adopting such a configuration allows the light emitted from the three laser diodes to be multiplexed.

In the above optical module, the first laser diode may be a red laser diode that emits red light. The second laser diode may be a green laser diode that emits green light. The third laser diode may be a blue laser diode that emits blue light. With this configuration, it is possible to form light of a desired color.

Details of Embodiments of the Present Disclosure

Embodiments of the optical module according to the present disclosure will be described below with reference to the drawings. In the drawings below, the same or corresponding elements are denoted by the same reference numerals, and the description thereof will not be repeated.

Embodiment 1

Figure 2:
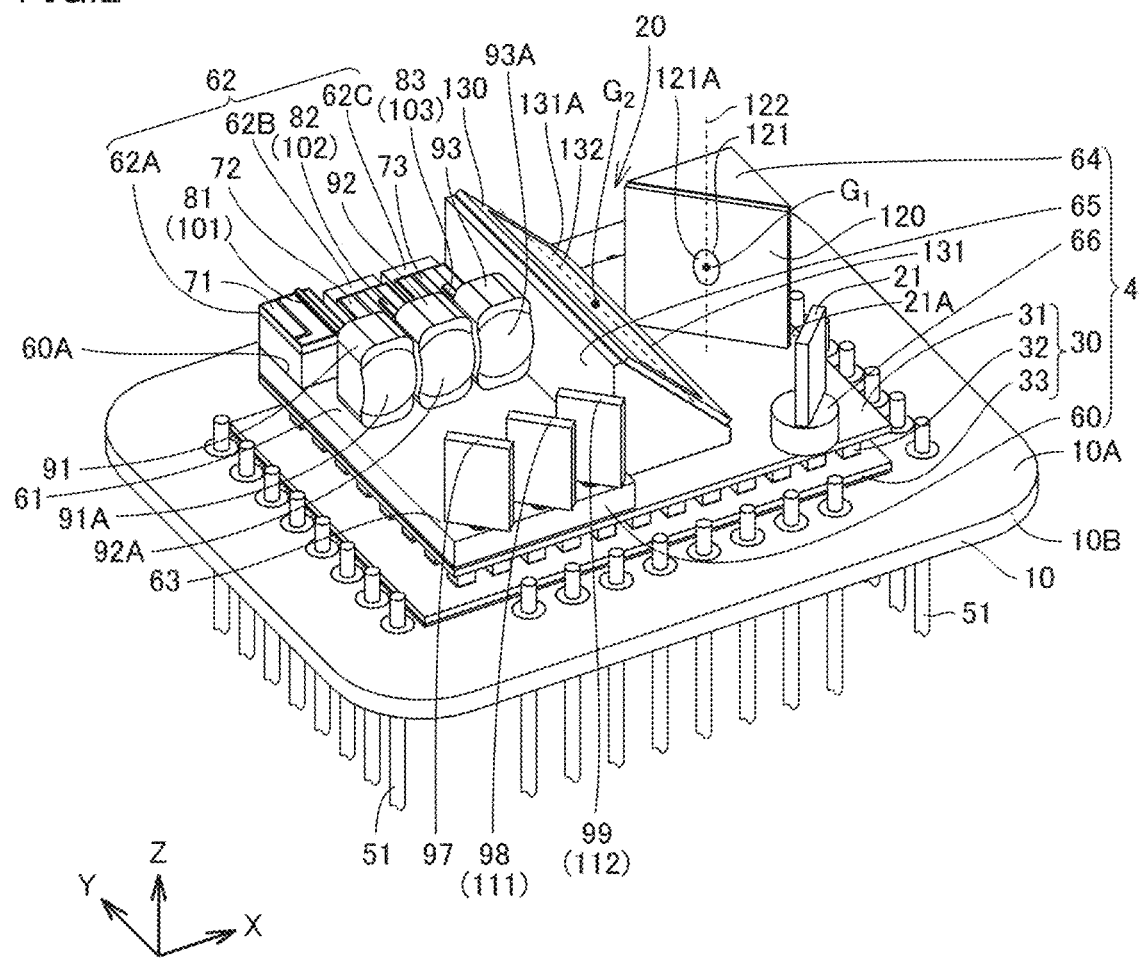
FIG. 2 is a schematic perspective view showing the structure of the optical module of Embodiment 1 with its cap removed therefrom.
Figure 3:
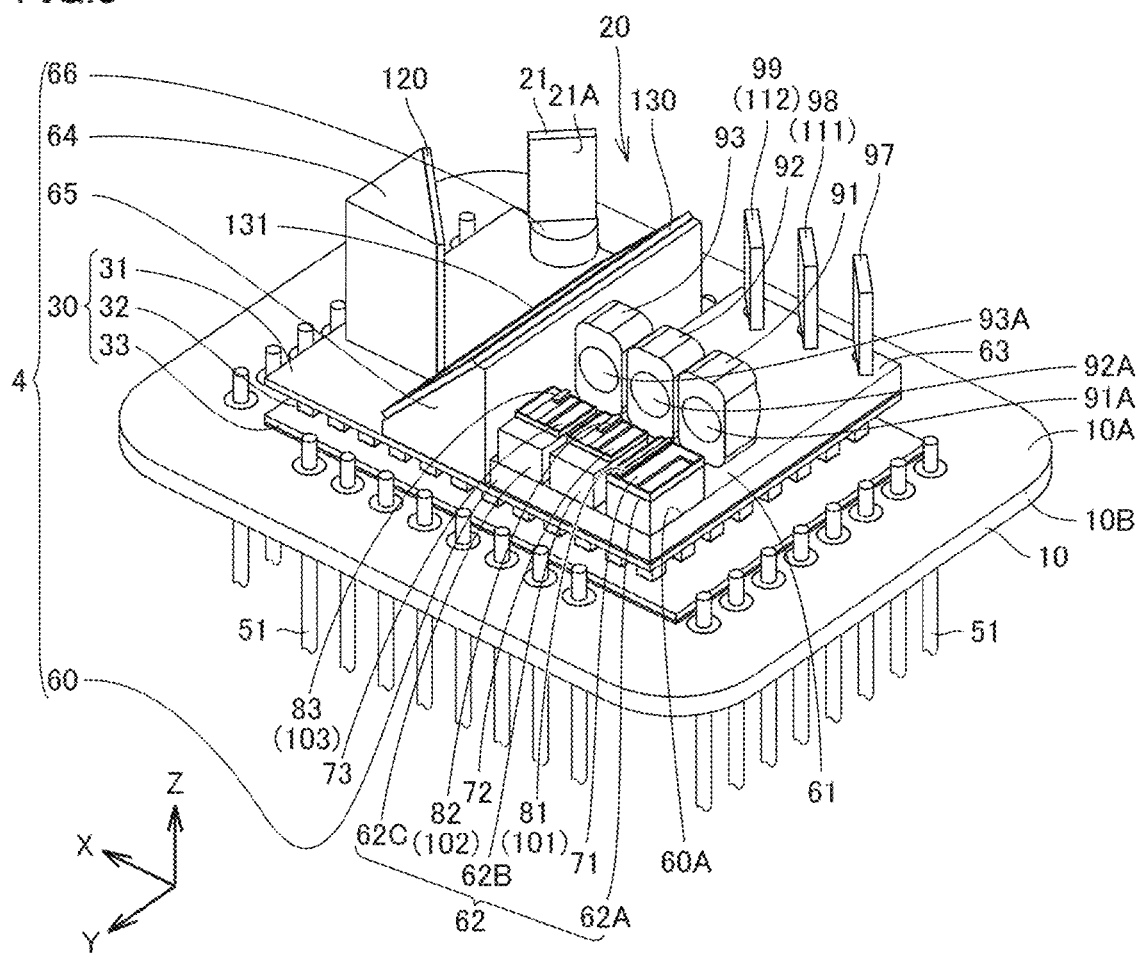
FIG. 3 is a schematic perspective view showing the structure of the optical module of Embodiment 1 with the cap removed therefrom.
Figure 6:
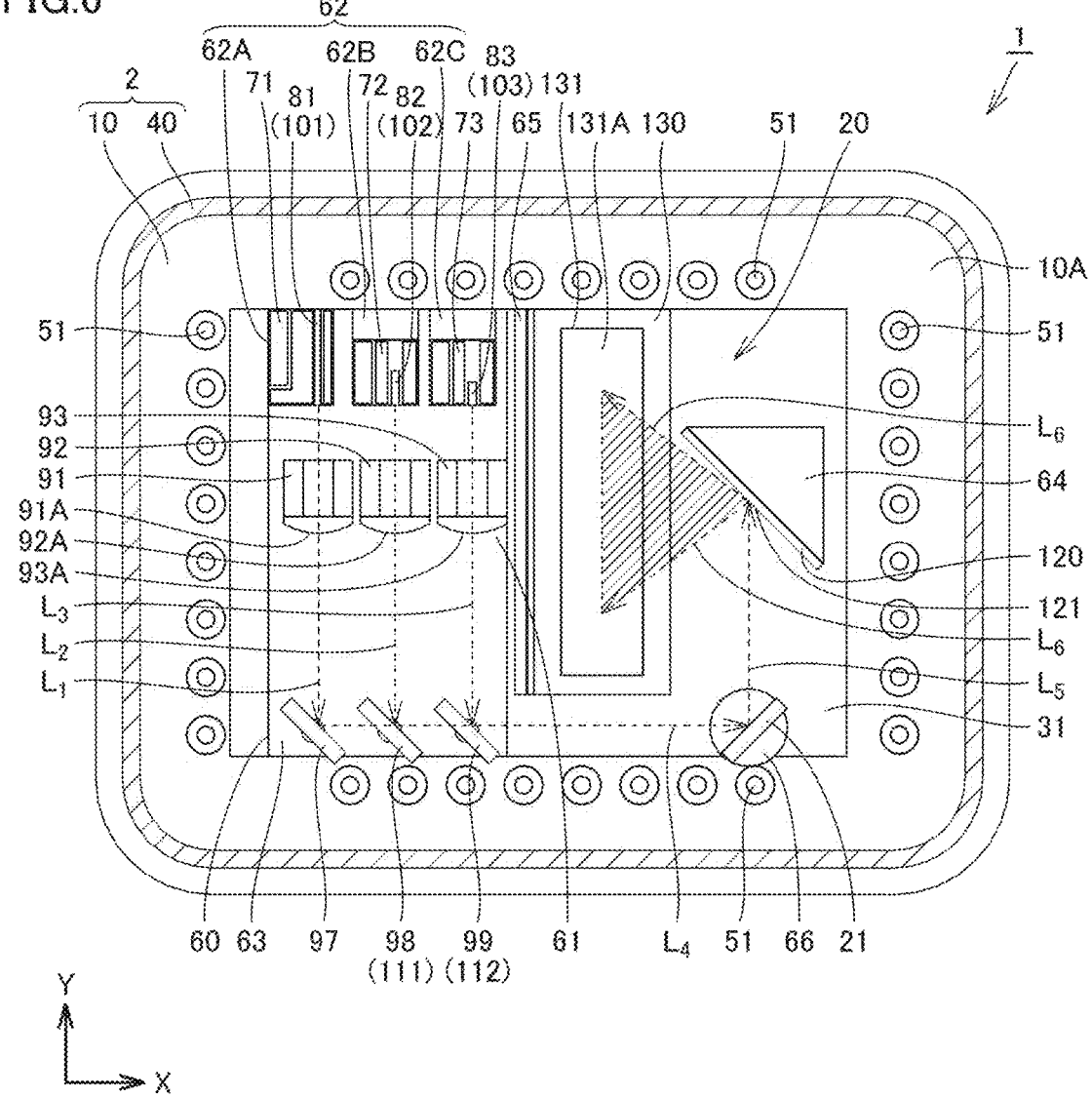
FIG. 6 is a schematic view showing the structure of the optical module in Embodiment 1.
Figure 7:
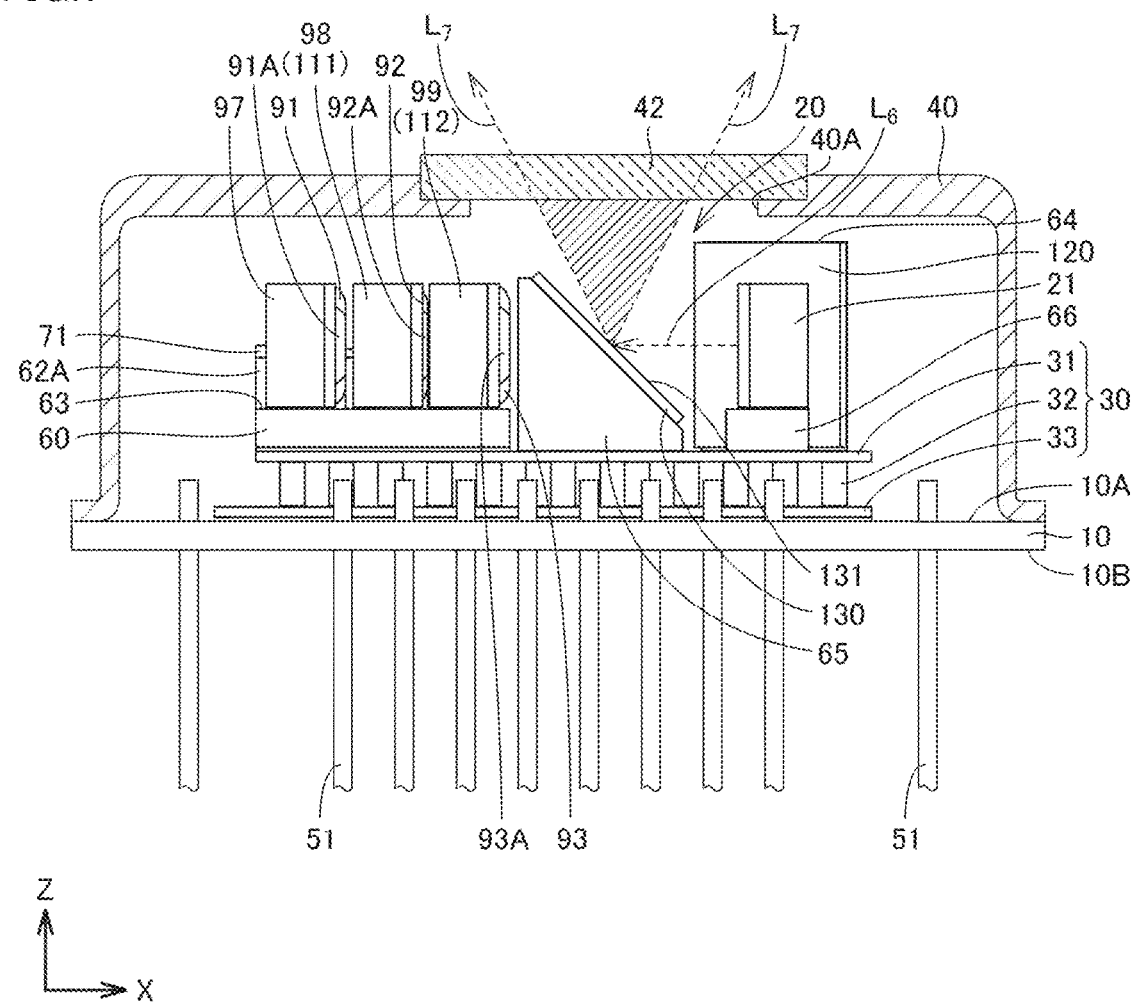
FIG. 7 is a schematic view showing the structure of the optical module in Embodiment 1.

Firstly, Embodiment 1 will be described with reference to FIGS. 1 to 7. FIG. 1 is a schematic perspective view showing the structure of an optical module in Embodiment 1. FIG. 2 is a perspective view corresponding to FIG. 1 with its cap removed therefrom. FIG. 3 is a perspective view corresponding to FIG. 1 with the cap removed therefrom, as observed from a viewpoint different from that of FIG. 2. FIG. 6 is a schematic view in an X-Y plane, with the cap 40 shown in cross section and the other components in plan view. FIG. 7 is a schematic view in an X-Z plane, with the cap 40 and the glass plate 42 shown in cross section and the other components in plan view.

Referring to FIGS. 1 to 3, the optical module 1 in the present embodiment includes a light-forming unit 20 configured to form light, and a protective member 2 which surrounds and seals the light-forming unit 20. The protective member 2 includes a base 10 as the base body, and a cap 40 as the lid welded to the base 10. In other words, the light-forming unit 20 is hermetically sealed by the protective member 2. The base 10 has a flat plate shape. The light-forming unit 20 is disposed on one main surface 10A of the base 10. The cap 40 is disposed on and in contact with the one main surface 10A of the base 10 to cover the light-forming unit 20. The base 10 has a plurality of lead pins 51 mounted thereon, the pins penetrating from another main surface 10B of the base 10 to the one main surface 10A and protruding from both sides of the one main surface 10A and the other main surface 10B. The base 10 and the cap 40 surround a space in which gas with the moisture reduced (or removed), such as dry air, is filled. Referring particularly to FIG. 7, the cap 40 has a window portion 40A penetrating therethrough in a region facing the main surface 10A of the base 10. A glass plate 42 is disposed to close the window portion 40A. The glass plate 42 has a flat plate shape. In the present embodiment, the protective member 2 is an airtight member that keeps the interior airtight. The window portion 40A thus formed in the region of the cap 40 facing the main surface 10A of the base 10 can reduce the stress acting on the glass plate 42 when the cap 40 is welded to the base 10. It is thus possible to keep the inside of the protective member 2 in a proper airtight state.

Referring to FIGS. 2 and 3, the light-forming unit 20 includes a base member 4, laser diodes 81, 82, and 83, filters 97, 98, and 99, MEMS 120 and 130, and a third mirror 21.

The base member 4 includes an electronic temperature control module 30, a base plate 60, MEMS bases 64 and 65, and a pedestal 66. The electronic temperature control module 30 includes a heat absorbing plate 31 and a heat dissipation plate 33 each having a flat plate shape, and semiconductor pillars 32 arranged side by side between the heat absorbing plate 31 and the heat dissipation plate 33 with electrodes interposed therebetween. The heat absorbing plate 31 and the heat dissipation plate 33 are made of alumina, for example. The electronic temperature control module 30 is disposed on the one main surface 10A of the base 10, with the heat dissipation plate 33 in contact with the one main surface 10A of the base 10.

The base plate 60, the MEMS bases 64 and 65, and the pedestal 66 are disposed on and in contact with the heat absorbing plate 31. The base plate 60 has a plate shape. The base plate 60 has one main surface 60A having a rectangular shape in plan view. The one main surface 60A of the base plate 60 includes a lens mounting region 61, a chip mounting region 62, and a filter mounting region 63. The chip mounting region 62 includes a first region 62A, a second region 62B, and a third region 62C. The first region 62A, the second region 62B, and the third region 62C are formed along one side of the main surface 60A. The first region 62A, the second region 62B, and the third region 62C are formed spaced apart from each other in the X axis direction. The lens mounting region 61 is arranged adjacent to and along the chip mounting region 62. The filter mounting region 63 is arranged in a region including another side opposing the above-described one side of the one main surface 60A, along the other side. The chip mounting region 62, the lens mounting region 61, and the filter mounting region 63 are parallel to each other.

The base plate 60 is greater in thickness in the first region 62A, the second region 62B, and the third region 62C of the chip mounting region 62 than in the lens mounting region 61 and the filter mounting region 63. The thickness of the base plate 60 in the lens mounting region 61 is equal to the thickness of the base plate 60 in the filter mounting region 63. The lens mounting region 61 and the filter mounting region 63 are in the same plane. As a result, the first region 62A, the second region 62B, and the third region 62C have their height (with respect to the lens mounting region 61, or, in the direction perpendicular to the lens mounting region 61) greater than those of the lens mounting region 61 and the filter mounting region 63.

On the first region 62A, the second region 62B, and the third region 62C, a first submount 71, a second submount 72, and a third submount 73, respectively, each having a flat plate shape are disposed side by side along the above-described one side of the one main surface 60A. The second submount 72 is arranged sandwiched between the first submount 71 and the third submount 73. The first submount 71 has the red laser diode 81 in chip form as a first laser diode 101 disposed thereon. As used herein, the chip form refers to the state not sealed by a package. The second submount 72 has the green laser diode 82 in chip form as a second laser diode 102 disposed thereon. The third submount 73 has the blue laser diode 83 in chip form as a third laser diode 103 disposed thereon. The red laser diode 81, the green laser diode 82, and the blue laser diode 83 have optical axes whose heights (distances between the optical axes and a reference plane which is the lens mounting region 61 on the one main surface 60A; distances from the reference plane in the Z axis direction) are adjusted to match each other by the first submount 71, the second submount 72, and the third submount 73.

On the lens mounting region 61, a first lens 91, a second lens 92, and a third lens 93 are disposed. The first lens 91, the second lens 92, and the third lens 93 have lens portions 91A, 92A, and 93A, respectively, each having a surface of lens form. The first lens 91, the second lens 92, and the third lens 93 each have its lens portion 91A, 92A, 93A and the remaining region formed integrally. The lens portions 91A, 92A, and 93A of the first lens 91, the second lens 92, and the third lens 93 have their central axes, i.e. the optical axes of the lens portions 91A, 92A, and 93A, matching the optical axes of the red laser diode 81, the green laser diode 82, and the blue laser diode 83, respectively. The first lens 91, the second lens 92, and the third lens 93 convert the spot sizes of the light emitted from the red laser diode 81, the green laser diode 82, and the blue laser diode 83, respectively (or, convert the beam shape on a certain projection plane into a desired shape). With the first lens 91, the second lens 92, and the third lens 93, each of the light emitted from the red laser diode 81, the green laser diode 82, and the blue laser diode 83 is converted into collimated light.

On the filter mounting region 63, the first filter 97, the second filter 98 as a first member 111, and the third filter 99 as a second member 112 are disposed. The first filter 97 is arranged on a straight line connecting the red laser diode 81 and the first lens 91. The second filter 98 is arranged on a straight line connecting the green laser diode 82 and the second lens 92. The third filter 99 is arranged on a straight line connecting the blue laser diode 83 and the third lens 93. The first filter 97, the second filter 98, and the third filter 99 have flat plate shapes with their main surfaces parallel to each other. The first filter 97, the second filter 98, and the third filter 99 are wavelength selective filters, for example. The first filter 97, the second filter 98, and the third filter 99 may be dielectric multi-layer film filters.

More specifically, the first filter 97 reflects red light. The second filter 98 transmits red light and reflects green light. The third filter 99 transmits red and green light and reflects blue light. In this manner, the first filter 97, the second filter 98, and the third filter 99 selectively transmit or reflect light of specific wavelengths. As a result, the first filter 97, the second filter 98, and the third filter 99 multiplex the light emitted from the red laser diode 81, the green laser diode 82, and the blue laser diode 83.

Referring to FIG. 6, the red laser diode 81, the lens portion 91A of the first lens 91, and the first filter 97 are arranged aligned (in the Y axis direction) along the light emission direction of the red laser diode 81. The green laser diode 82, the lens portion 92A of the second lens 92, and the second filter 98 are arranged aligned (in the Y axis direction) along the light emission direction of the green laser diode 82. The blue laser diode 83, the lens portion 93A of the third lens 93, and the third filter 99 are arranged aligned (in the Y axis direction) along the light emission direction of the blue laser diode 83.

The red laser diode 81, the green laser diode 82, and the blue laser diode 83 have their emission directions parallel to each other. The first filter 97, the second filter 98, and the third filter 99 have their main surfaces inclined 45° with respect to the emission directions (Y axis direction) of the red laser diode 81, the green laser diode 82, and the blue laser diode 83, respectively.

Referring to FIGS. 2 and 3, the pedestal 66 has a cylindrical shape. The pedestal 66 is disposed on the heat absorbing plate 31. The pedestal 66 and the base plate 60 are arranged spaced apart from each other in the X axis direction. The pedestal 66 has the third mirror 21 disposed thereon. The third mirror 21 has a third reflective surface 21A that reflects the light multiplexed by the filters 97, 98, and 99. The third mirror 21 and the filters 97, 98, and 99 are arranged side by side along the X axis direction. The third mirror 21 is arranged such that the third reflective surface 21A is positioned in a region that corresponds to the optical path of the light multiplexed by the filters 97, 98, and 99.

The first MEMS base 64 and the second MEMS base 65 each have a triangular prism (right triangular prism) shape. The first MEMS base 64 is disposed on the heat absorbing plate 31, with one bottom surface of the triangular prism in contact with the heat absorbing plate 31. The second MEMS base 65 is disposed on the heat absorbing plate 31, with one side surface of the triangular prism in contact with the heat absorbing plate 31. The first MEMS base 64 and the pedestal 66 are arranged spaced apart from each other in the Y axis direction. The second MEMS base 65 is arranged between the base plate 60 and the first MEMS base 64 in the X axis direction.

Figure 4:
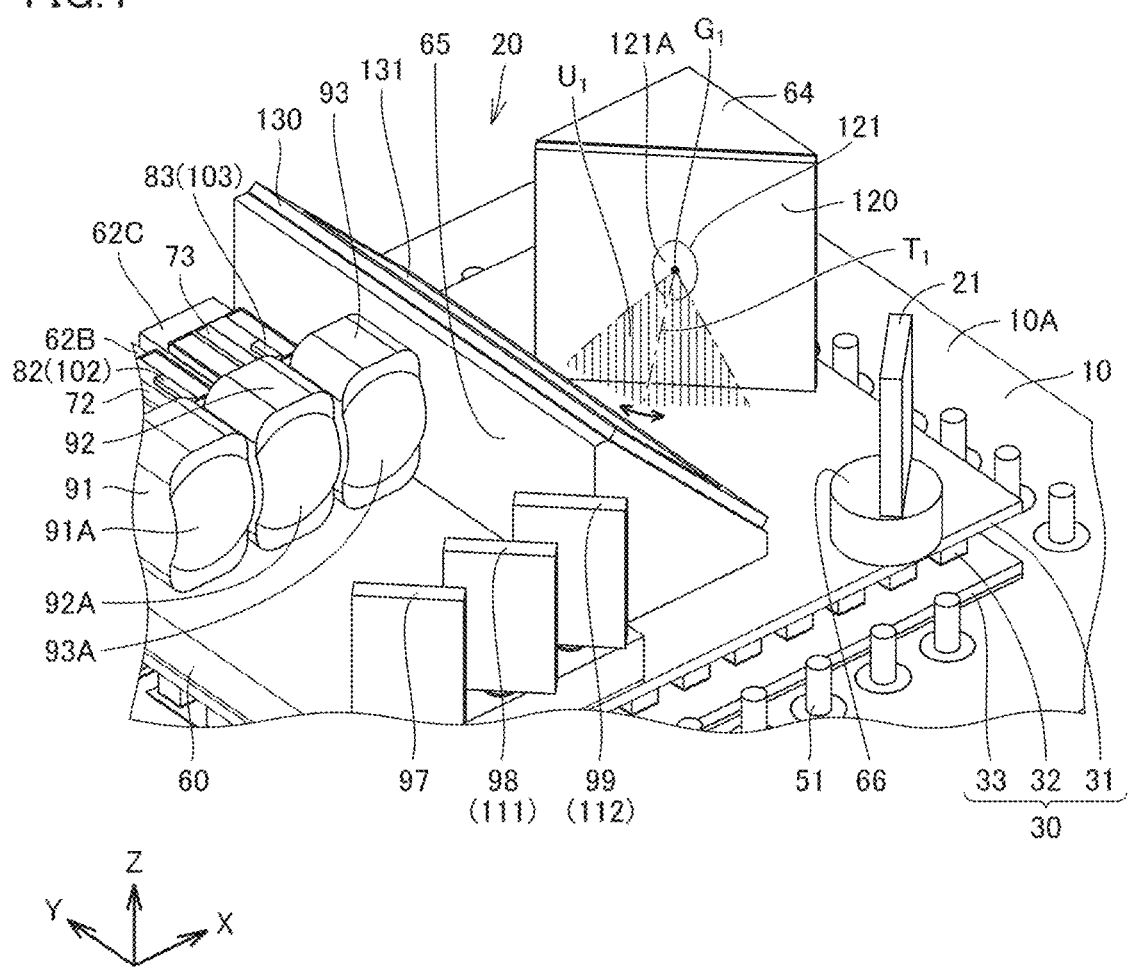
FIG. 4 is a diagram showing a first plane formed by a first mirror.

Referring to FIGS. 2 and 4, the first MEMS 120, which includes a first mirror 121, is disposed on one side surface of the first MEMS base 64. In the present embodiment, the first MEMS 120 is a piezoelectric MEMS. This allows the deflection angle of the first mirror 121 to be increased. In the present embodiment, the first mirror 121 has a disk shape. The first MEMS 120 is arranged such that the first mirror 121 is positioned in a region that corresponds to the optical path of the light reflected by the third reflective surface 21A of the third mirror 21. The first mirror 121 has a first reflective surface 121A that reflects the light reflected by the third reflective surface 21A. The first mirror 121 oscillates to form a first plane $U_1$ with the trajectory of a first normal $T_1$ which is the normal at a center point $G_1$ of the first reflective surface 121A. It should be noted that the center point of the first reflective surface 121A refers to the midpoint of an oscillation axis 122 of the first mirror 121 in a projected image when the oscillation axis is projected, relative to the first reflective surface 121A, in the direction perpendicular to the plane including the outer edge of the first reflective surface 121A. In the present embodiment, the first mirror 121 oscillates by resonance. The resonance frequency of the first mirror 121 is, for example, 20 kHz or higher. This allows the first MEMS 120 including the first mirror 121 to scan the light reflected by the third reflective surface 21A. As a more suitable example, the resonance frequency of the first mirror 121 may be 30 kHz or higher. As such, the use of the first MEMS 120 that oscillates in one direction makes it possible to increase the resonance frequency.

Figure 5:
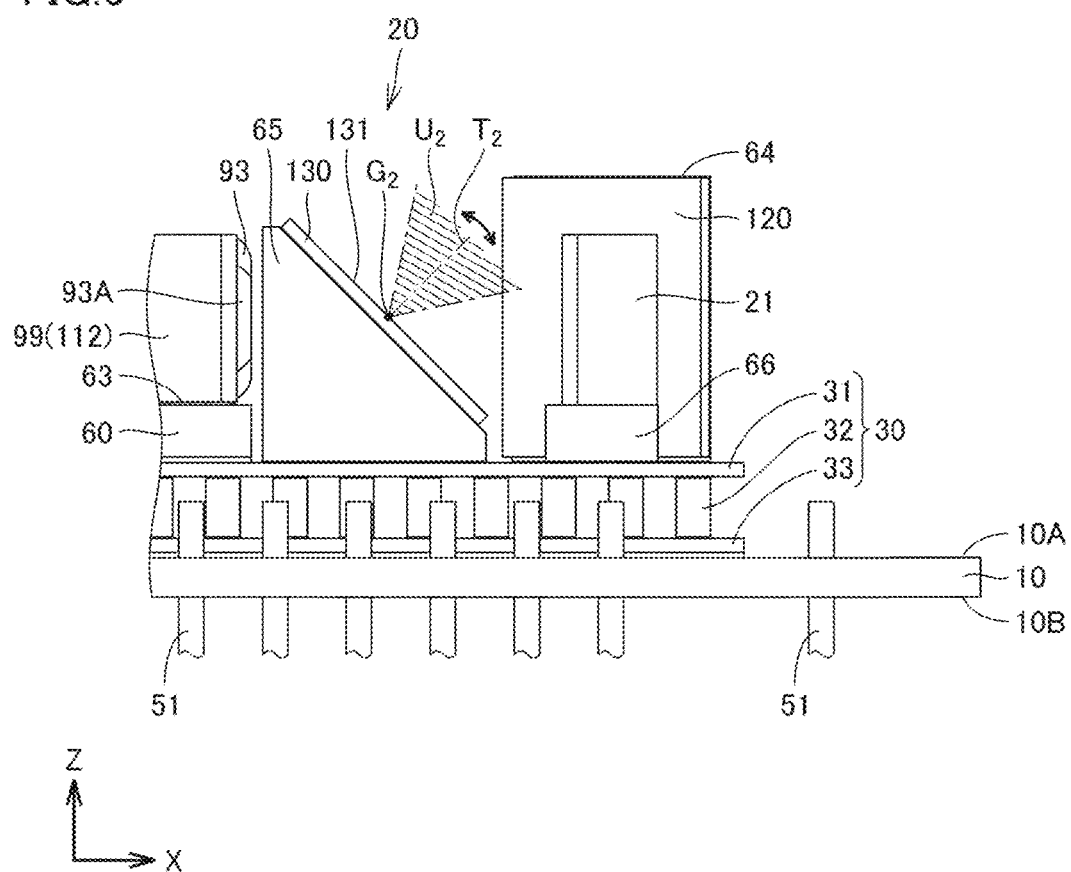
FIG. 5 is a diagram showing a second plane formed by a second mirror.

Referring to FIGS. 2 and 5, the second MEMS 130, which includes a second mirror 131, is disposed on another side surface of the second MEMS base 65. In the present embodiment, the second mirror 131 has a flat plate shape. Referring to FIG. 2, the second mirror 131 has a rectangular shape in plan view in a direction perpendicular to the above-described other side surface of the second MEMS base 65. The second MEMS 130 is arranged such that the second mirror 131 is positioned in a region that corresponds to the optical path of the light scanned by the first mirror 121. In the present embodiment, the second MEMS 130 is a piezoelectric MEMS. This allows the deflection angle of the second mirror 131 to be increased. The second mirror 131 has a second reflective surface 131A that reflects the light scanned by the first mirror 121. The second mirror 131 oscillates to form a second plane $U_2$ with the trajectory of a second normal $T_2$ which is the normal at a center point $G_2$ of the second reflective surface 131A. The first plane $U_1$ and the second plane $U_2$ are orthogonal to each other. It should be noted that the center point of the second reflective surface 131A refers to the midpoint of an oscillation axis 132 of the second mirror 131 in a projected image when the oscillation axis is projected, relative to the second reflective surface 131A, in the direction perpendicular to the plane including the outer edge of the second reflective surface 131A. In the present embodiment, the oscillation of the second mirror 131 is a non-resonant (linear mode) type oscillation. The drive frequency of the second mirror 131 is, for example, 50 Hz to 120 Hz. This allows the second MEMS 130 including the second mirror 131 to scan the light scanned by the first MEMS 120.

The electronic temperature control module 30 is arranged between the base 10 on one side and the base plate 60 and the MEMS bases 64 and 65 on the other side. The heat absorbing plate 31 is arranged in contact with the base plate 60 and the MEMS bases 64 and 65. The heat dissipation plate 33 is arranged in contact with the one main surface 10A of the base 10. In the present embodiment, the electronic temperature control module 30 is a Peltier module (Peltier element) which is an electronic cooling module. In the present embodiment, as a current is passed through the electronic temperature control module 30, the heat of the base plate 60 and the MEMS bases 64 and 65, which are in contact with the heat absorbing plate 31, transfers to the base 10, whereby the base plate 60 and the MEMS bases 64 and 65 are cooled. As a result, the temperatures of the laser diodes 81, 82, and 83, and the MEMS 120 and 130 are each controlled to fall within an appropriate temperature range. Maintaining the red laser diode 81, the green laser diode 82, and the blue laser diode 83 in a proper temperature range enables formation of light of a desired color with precision. Further, controlling the MEMS 120 and 130 to an appropriate temperature enables improvement of their operational stabilities against the temperature changes.

An operation of the optical module 1 in the present embodiment will now be described. Referring to FIGS. 6 and 7, the red light emitted from the red laser diode 81 travels along an optical path $L_1$. This red light enters the lens portion 91A of the first lens 91, where the spot size of the light is converted. Specifically, for example, the red light emitted from the red laser diode 81 is converted into collimated light. The red light with its spot size converted in the first lens 91 travels along the optical path $L_1$ and falls on the first filter 97.

The first filter 97 reflects red light, so the light emitted from the red laser diode 81 travels further along an optical path $L_4$ to fall on the second filter 98. The second filter 98 transmits red light, so the light emitted from the red laser diode 81 travels further along the optical path $L_4$ to fall on the third filter 99. The third filter 99 transmits red light, so the light emitted from the red laser diode 81 travels further along the optical path $L_4$ to reach the third mirror 21. The light that has reached the third mirror 21 is reflected by the third mirror 21, and the light travels further along an optical path $L_5$ to reach the first mirror 121.

The green light emitted from the green laser diode 82 travels along an optical path $L_2$. This green light enters the lens portion 92A of the second lens 92, where the spot size of the light is converted. Specifically, for example, the green light emitted from the green laser diode 82 is converted into collimated light. The green light with its spot size converted in the second lens 92 travels along the optical path $L_2$ to fall on the second filter 98.

The second filter 98 reflects green light, so the light emitted from the green laser diode 82 travels further along the optical path $L_4$ to fall on the third filter 99. The third filter 99 transmits green light, so the light emitted from the green laser diode 82 travels further along the optical path $L_4$ to reach the third mirror 21. The light that has reached the third mirror 21 is reflected by the third mirror 21, and the light travels further along the optical path $L_5$ to reach the first mirror 121.

The blue light emitted from the blue laser diode 83 travels along an optical path $L_3$. This blue light enters the lens portion 93A of the third lens 93, where the spot size of the light is converted. Specifically, for example, the blue light emitted from the blue laser diode 83 is converted into collimated light. The blue light with its spot size converted in the third lens 93 travels along the optical path $L_3$ to fall on the third filter 99.

The third filter 99 reflects blue light, so the light emitted from the blue laser diode 83 travels further along the optical path $L_4$ to reach the third mirror 21. The light that has reached the third mirror 21 is reflected by the third mirror 21, and the light travels further along the optical path $L_5$ to reach the first mirror 121.

The second filter 98 multiplexes the light (of red) emitted from the red laser diode 81 with the light (of green) emitted from the green laser diode 82. The third filter 99 further multiplexes the red and green light multiplexed by the second filter 98 with the light (of blue) emitted from the blue laser diode 83.

The light (multiplexed light) formed with the red, green, and blue light multiplexed in the above-described manner travels along the optical path $L_5$ to reach the first mirror 121. Then, the multiplexed light is scanned with the first mirror 121 being driven, and the light travels along optical paths $L_6$ to reach the second mirror 131. The multiplexed light scanned by the first mirror 121 is scanned with the second mirror 131 being driven, and the light travels along optical paths $L_7$ to reach the window portion 40A. The multiplexed light scanned by the second mirror 131 transmits the window portion 40A and is emitted to the outside. As the first mirror 121 and the second mirror 131 oscillate to make the first plane $U_1$ and the second plane $U_2$ orthogonal to each other, the light is scanned two-dimensionally. The multiplexed light scanned by the first and second mirrors 121 and 131 in the above-described manner then draws characters and/or figures.

Here, in the optical module 1 in the present embodiment, the laser diodes 81, 82, 83, the first MEMS 120, and the second MEMS 130 are sealed by the protective member 2. This enables reduction in size. Further, the first mirror 121 and the second mirror 131 perform scanning of light in two different directions. This can suppress the propagation of oscillation in one direction to the other direction, as in the case when a single mirror performs two-dimensional scanning of light. The optical module 1 in the present embodiment is capable of easy control of the first mirror 121 and the second mirror 131, while realizing reduction in size, and is capable of two-dimensional drawing.

Further, according to the optical module 1 in the present embodiment, it is possible to increase the deflection angles of the first mirror 121 and the second mirror 131. This allows for a larger area to be drawn. It is also possible to increase the resonance frequency of the first mirror 121. With this, the number of scanning lines being scanned increases, and thus the number of pixels increases. This allows for high quality drawing. Furthermore, the disposition of the third mirror 21 makes it possible to control the angle between the first plane $U_1$ and the optical path $L_5$. The angle between the first plane $U_1$ and the optical path $L_5$ is ±10° or less, for example. This can suppress the scanning distortion of the light scanned by the first mirror 121. In addition, disposing the third mirror 21 enables control of the incidence angle of the light incident on the first reflective surface 121A of the first mirror 121. It is therefore possible to obtain a good picture while suppressing the widening of the spot diameter of the light incident on the first reflective surface 121A.

In the above embodiment, the case where the first MEMS 120 and the second MEMS 130 are both piezoelectric MEMS has been described. However, not limited thereto, the first MEMS 120 and the second MEMS 130 may be electrostatic MEMS.

In the above embodiment, the case where the oscillation of the first mirror 121 is of a resonant type and the oscillation of the second mirror 131 is of a non-resonant type has been described. However, not limited thereto, the oscillation of both of the first mirror 121 and the second mirror 131 may be of the resonant type. Further, the oscillation of the second mirror 131 may be of the resonant type and the oscillation of the first mirror 121 may be of the non-resonant type.

In the above embodiment, the case where the first mirror 121 oscillates to form the first plane $U_1$ and the second mirror 131 oscillates to form the second plane $U_2$ has been described. However, not limited thereto, the first mirror 121 may oscillate to form a plane orthogonal to the first plane $U_1$ and the second mirror 131 may oscillate to form a plane orthogonal to the second plane $U_2$.

Embodiment 2

Figure 9:
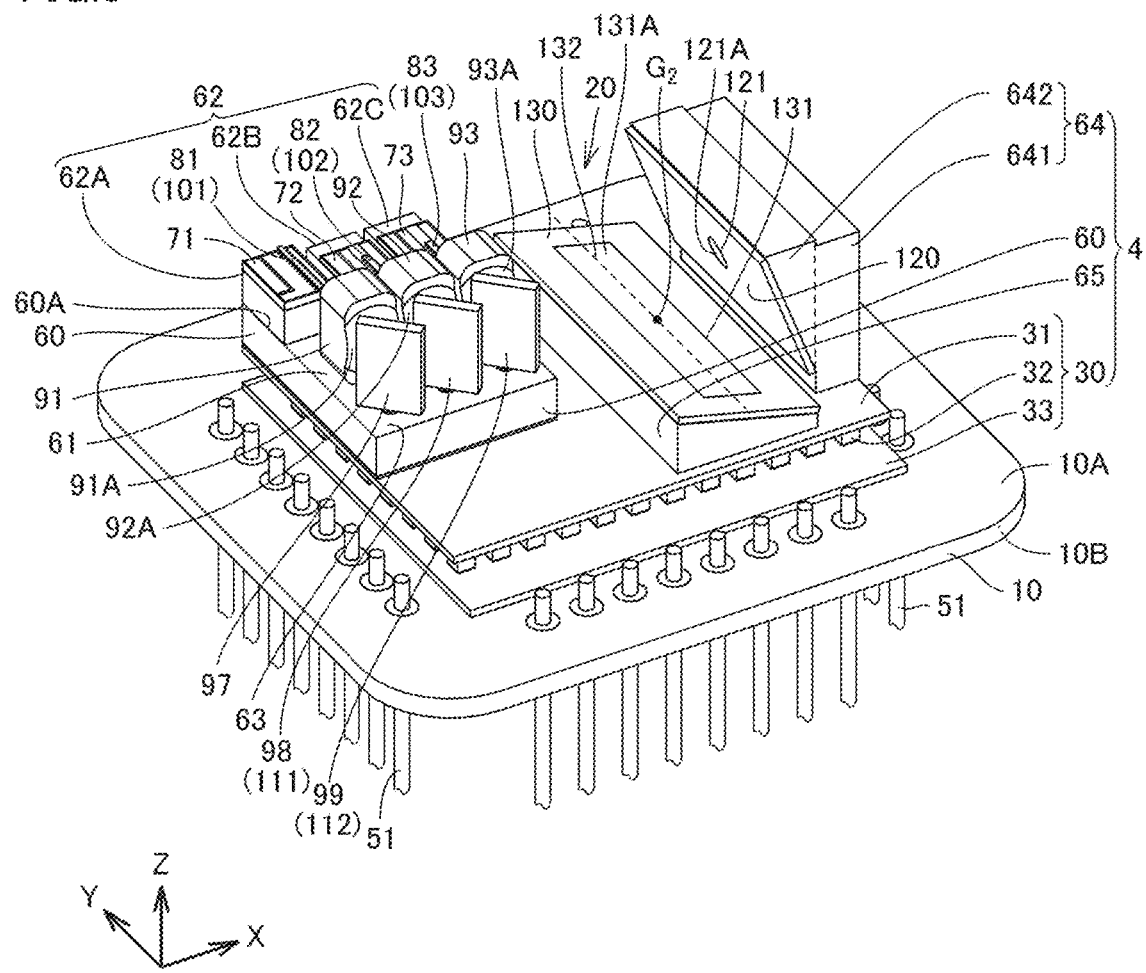
FIG. 9 is a schematic perspective view showing the structure of the optical module of Embodiment 2 with its cap removed therefrom.
Figure 10:
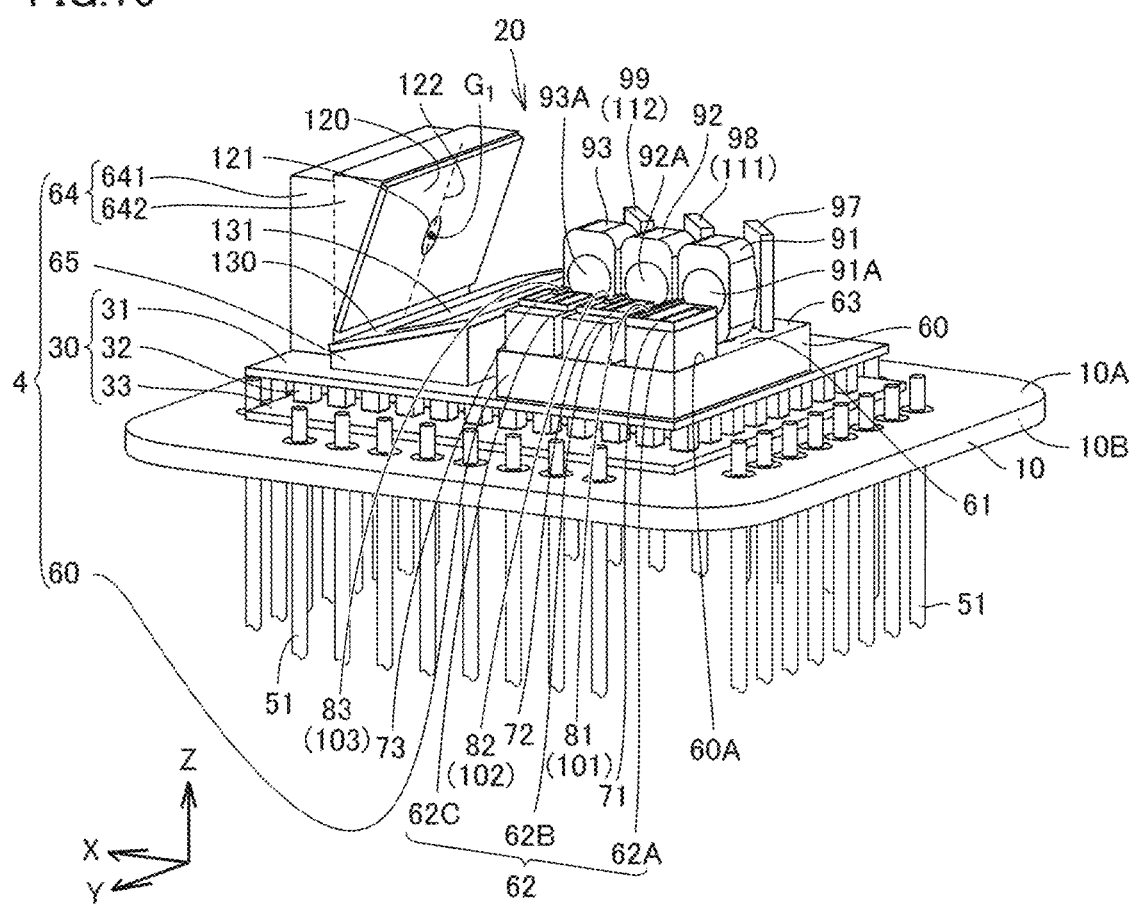
FIG. 10 is a schematic perspective view showing the structure of the optical module of Embodiment 2 with the cap removed therefrom.
Figure 11:
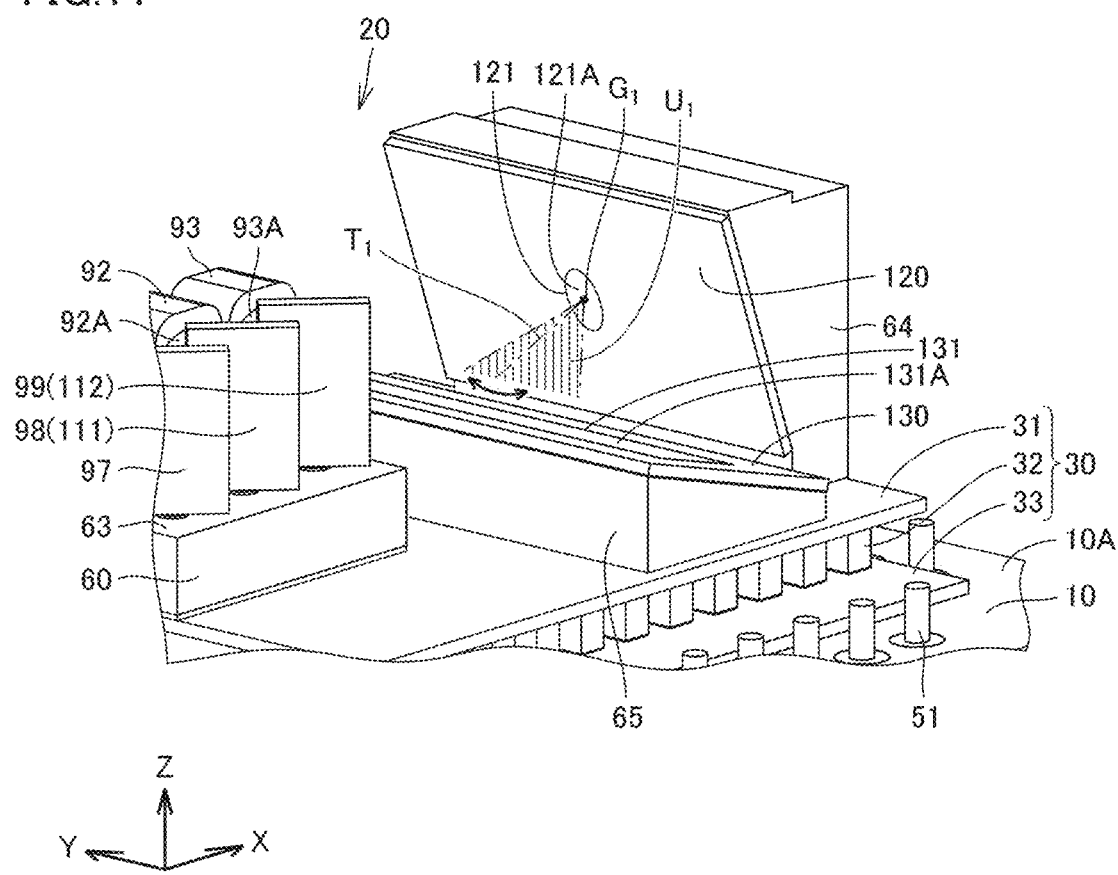
FIG. 11 is a diagram showing a first plane formed by a first mirror.
Figure 12:
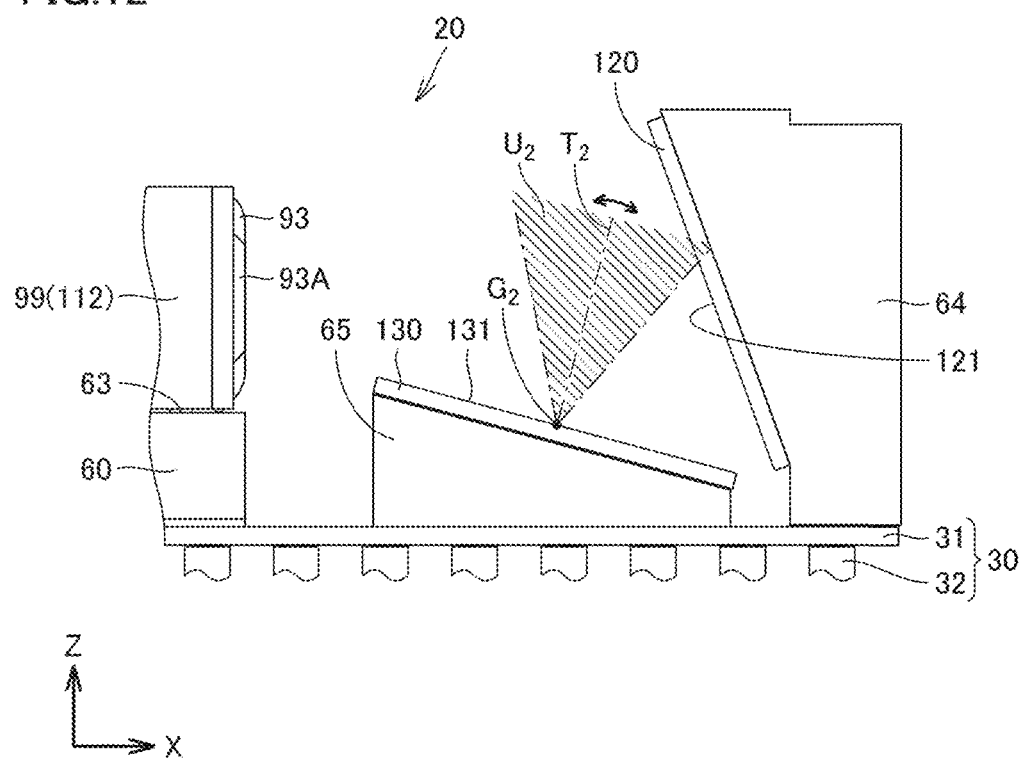
FIG. 12 is a diagram showing a second plane formed by a second mirror.
Figure 13:
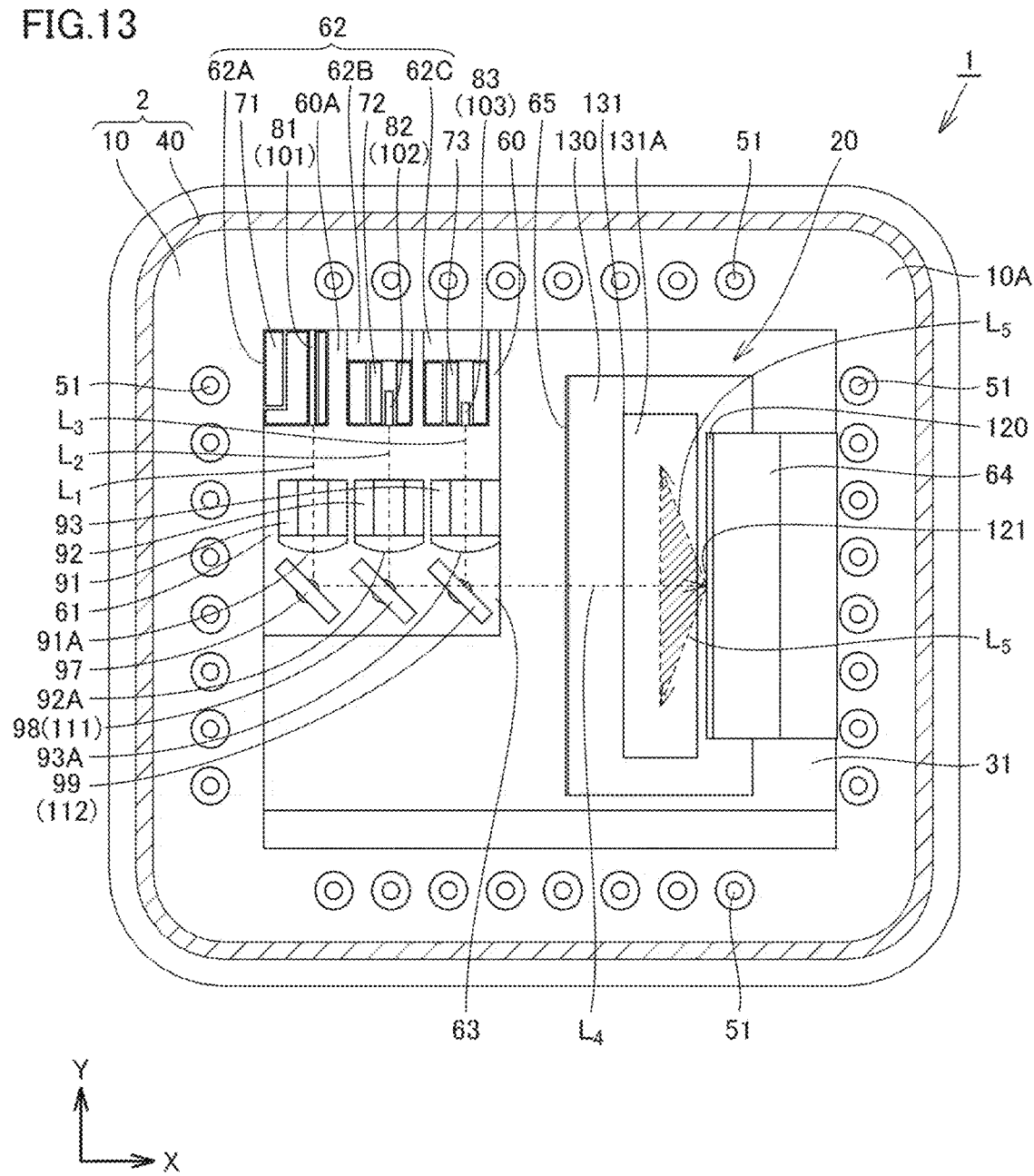
FIG. 13 is a schematic view showing the structure of the optical module in Embodiment 2.
Figure 14:
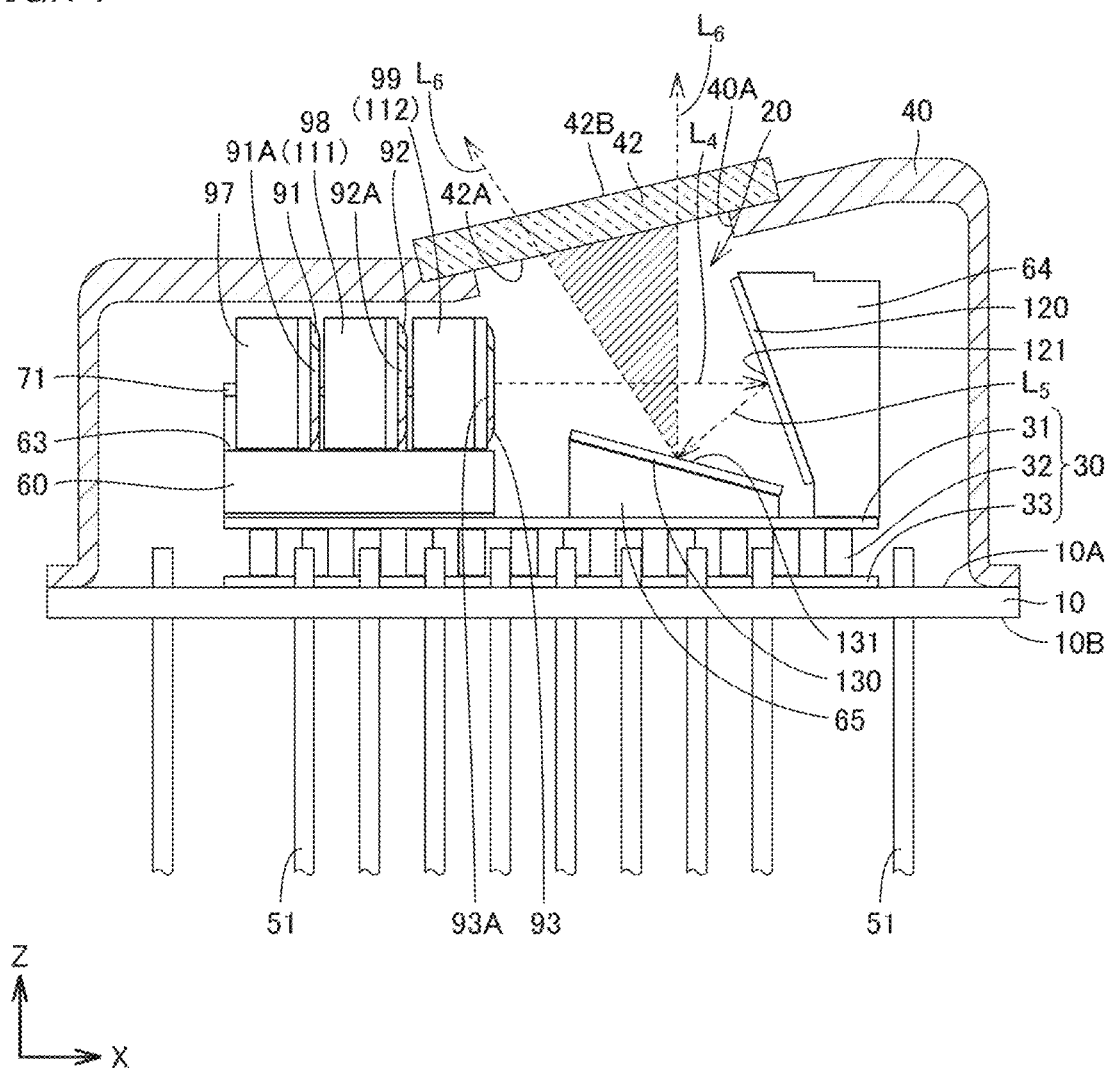
FIG. 14 is a schematic view showing the structure of the optical module in Embodiment 2.

Another embodiment, Embodiment 2, will now be described with reference to FIGS. 8 to 14. FIG. 9 is a perspective view corresponding to FIG. 8 with the cap removed therefrom. FIG. 10 is a perspective view corresponding to FIG. 8 with the cap removed therefrom, as observed from a viewpoint different from that of FIG. 9. FIG. 13 is a schematic view in an X-Y plane, with the cap 40 shown in cross section and the other components in plan view. FIG. 14 is a schematic view in an X-Z plane, with the cap 40 and the glass plate 42 shown in cross section and the other components in plan view.

The optical module 1 of Embodiment 2 basically has a similar structure and produces similar effects as the optical module 1 of Embodiment 1. The optical module 1 of Embodiment 2 differs from that of Embodiment 1 in the arrangement of the first MEMS 120 and the second MEMS 130. Embodiment 2 will be described below, focusing on the differences from Embodiment 1.

Figure 8:
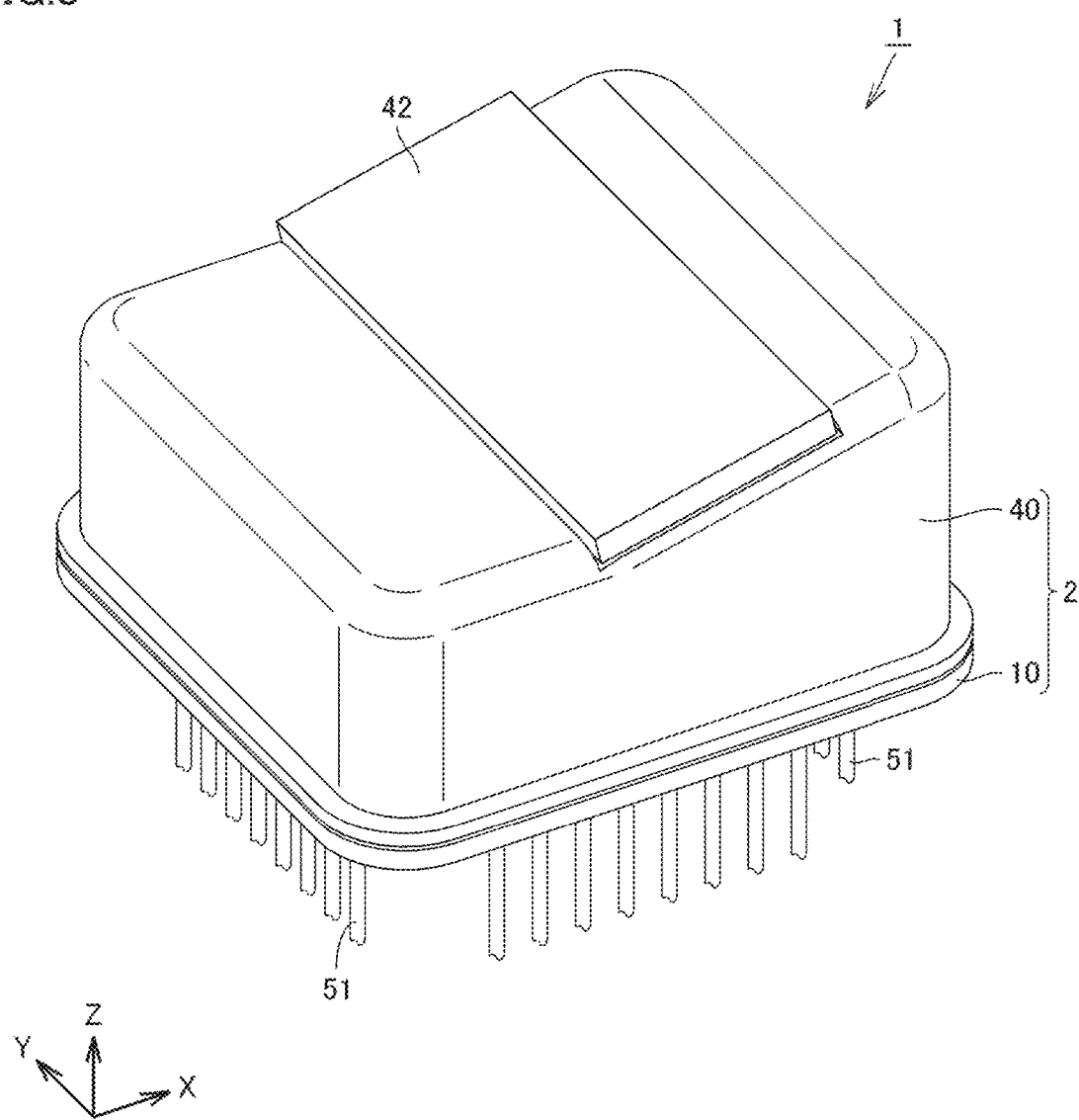
FIG. 8 is a schematic perspective view showing the structure of an optical module in Embodiment 2.

Referring to FIGS. 8 and 14, the glass plate 42 has an incident surface 42A on which the light scanned by the second MEMS 130 enters, and an emitting surface 42B from which the light is emitted. The glass plate 42 is arranged such that the incident surface 42A and the emitting surface 42B are inclined with respect to the main surface 10A of the base 10.

Referring to FIGS. 9 and 10, the first MEMS base 64 has a shape of a rectangular parallelepiped with a triangular prism connected to one side surface thereof. The first MEMS base 64 includes a first portion 641 and a second portion 642. The first portion 641 has a rectangular parallelepiped shape. The second portion 642 has a triangular prism shape. The first portion 641 is disposed on the heat absorbing plate 31, with one side surface of the rectangular parallelepiped in contact with the heat absorbing plate 31. The second portion 642 is arranged to be connected to another side surface of the first portion 641. The second portion is disposed on the first portion such that one side surface of the second portion 642 is connected to the first portion. The second MEMS base 65 is disposed between the base plate 60 and the first MEMS base 64 in the X axis direction. The second MEMS base 65 has a quadrangular prism shape. The second MEMS base 65 has a trapezoidal shape in its cross section perpendicular to the Y axis direction. The second MEMS base 65 is disposed on the heat absorbing plate 31, with one side surface of the quadrangular prism in contact with the heat absorbing plate 31. The second MEMS 130 is disposed on another side surface of the second MEMS base 65. It should be noted that the third mirror 21 is not disposed in the present embodiment.

Referring to FIGS. 11 to 14, the first MEMS 120 is arranged such that its first mirror 121 is positioned in a region that corresponds to the optical path of the light multiplexed by the filters 97, 98, and 99. The second MEMS 130 is arranged such that its second mirror 131 is positioned in a region that corresponds to the optical path of the light scanned by the first mirror 121. The first plane $U_1$ formed by the oscillation of the first mirror 121 and the second plane $U_2$ formed by the oscillation of the second mirror 131 are orthogonal to each other.

A description will now be given of how the operation of the optical module 1 of Embodiment 2 differs from that of Embodiment 1. Referring to FIGS. 13 and 14, the light (multiplexed light) formed with the red, green, and blue light multiplexed travels along an optical path $L_4$ to reach the first mirror 121. The multiplexed light is scanned with the first mirror 121 being driven, and the light travels along optical paths $L_5$ to reach the second mirror 131. The multiplexed light scanned by the first mirror 121 is scanned with the second mirror 131 being driven, and the light travels along optical paths $L_6$ to reach the window portion 40A. The multiplexed light scanned by the second mirror 131 transmits the window portion 40A and is emitted to the outside.

Adopting such a structure allows the first MEMS 120 and the second MEMS 130 to be placed closer together. The second reflective surface 131A of the second mirror 131 can thus be made smaller in area. This enables reduction in size of the optical module 1. The optical module 1 having the structure of Embodiment 2 above as well, like the optical module of Embodiment 1, is capable of easy control of the first mirror 121 and the second mirror 131, while realizing reduction in size, and is capable of two-dimensional drawing.

While the description was made about the configuration in which the optical module 1 includes the red laser diode 81, the green laser diode 82, and the blue laser diode 83 in the above embodiments, the configuration is not limited thereto; the optical module may include one or two laser diodes emitting one or two colors of light, i.e., one or two of the red laser diode 81, the green laser diode 82, and the blue laser diode 83. Alternatively, infrared light or the like may be added to obtain four or more types of light emitted from the laser diodes. Still alternatively, infrared light alone may be emitted from a laser diode. Further, while the description was made about the case of adopting wavelength selective filters as the first filter 97, the second filter 98, and the third filter 99 in the above embodiments, the filters may be polarization combining filters, for example.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

DESCRIPTION OF REFERENCE NUMERALS

1: optical module; 2: protective member; 4: base member; 10: base; 10A, 10B, 60A: main surface; 20: light-forming unit; 21: third mirror; 21A: third reflective surface; 30: electronic temperature control module; 31: heat absorbing plate; 32: semiconductor pillar; 33: heat dissipation plate; 40: cap; 40A: window portion; 42: glass plate; 42A: incident surface; 42B: emitting surface; 51: lead pin; 60: base plate; 61: lens mounting region; 62: chip mounting region; 62A: first region; 62B: second region; 62C: third region; 63: filter mounting region; 64: first MEMS base; 65: second MEMS base; 66: pedestal; 71: first submount; 72: second submount; 73: third submount; 81: red laser diode; 82: green laser diode; 83: blue laser diode; 91: first lens; 91A, 92A, 93A: lens portion; 92: second lens; 93: third lens; 97: first filter; 98: second filter; 99: third filter; 101: first laser diode; 102: second laser diode; 103: third laser diode; 111: first member; 112: second member; 120: first MEMS; 121: first mirror; 121A: first reflective surface; 122, 132: oscillation axis; 130: second MEMS; 131: second mirror; 131A: second reflective surface; 641: first portion; 642: second portion; $G_1$, $G_2$: center point; $L_1$, $L_2$, $L_3$, $L_4$, $L_5$, $L_6$, $L_7$: optical path; $T_1$: first normal; $T_2$: second normal; $U_1$: first plane; and $U_2$: second plane.

The invention claimed is:

1. A scanning optical module comprising:
  a light-forming unit configured to form light; and
  a protective member surrounding and sealing the light-forming unit;
  the protective member including
    a base body having a flat plate shape and a main surface,
    a lid disposed on the main surface and having a window portion in a region of the lid facing the main surface, the window portion penetrating through the lid, and
    a window closing the window portion,
  the light-forming unit including
    a laser diode,
    a first MEMS including a first mirror having a first reflective surface that reflects and scans light from the laser diode, the first mirror oscillating to form a first plane with a trajectory of a first normal which is a normal at a center point of the first reflective surface, and
    a second MEMS including a second mirror having a second reflective surface that reflects light from the first mirror toward the window portion and scans light from the first mirror, the second mirror oscillating to form a second plane orthogonal to the first plane with a trajectory of a second normal which is a normal at a center point of the second reflective surface.

2. The scanning optical module according to claim 1, wherein
  the light-forming unit further includes a base member including an electronic temperature control module, and
  the first MEMS and the second MEMS are disposed on the base member of the light-forming unit.

3. The scanning optical module according to claim 2, wherein the light-forming unit further includes
  a plurality of said laser diodes, and
  a filter that multiplexes light emitted from the plurality of laser diodes.

4. The scanning optical module according to claim 1, wherein the light-forming unit further includes
  a plurality of said laser diodes, and
  a filter that multiplexes light emitted from the plurality of laser diodes.

5. The scanning optical module according to claim 1, wherein the second mirror is disposed between the laser diode and the first mirror.

6. The scanning optical module according to claim 1, further comprising a third mirror disposed in a region that corresponds to an optical path between the laser diode and the first mirror,
  the angle between the first plane and an optical path from the third mirror to the first mirror is less than or equal to ±10°, and
  an optical path from the first mirror to the second mirror is parallel to a main surface of a heat absorbing plate.

7. The scanning optical module according to claim 1, wherein an optical path from the laser diode to the first mirror is parallel to a main surface of a heat absorbing plate, and an optical path from the first mirror to the second mirror extends along a direction crossing the main surface of the heat absorbing plate.

8. The scanning optical module according to claim 7, wherein the protective member has a window portion, the scanning optical module further includes a glass plate disposed to close the window portion, the glass plate has an incident surface on which the light scanned by the second mirror enters, and the glass plate has an emitting surface from which the light is emitted, and the glass plate is arranged such that the incident surface and the emitting surface are inclined with respect to the main surface of the heat absorbing plate.

9. A scanning optical module comprising:

a light-forming unit configured to form light; and a protective member surrounding and sealing the light-forming unit;

the protective member including
   a base body having a flat plate shape and a main surface, and
   a lid disposed on the main surface and having a window portion in a region of the lid facing the main surface, the light-forming unit including
   a laser diode,
   a first MEMS including a first mirror having a first reflective surface that reflects and scans light from the laser diode, the first mirror oscillating to form a first plane with a trajectory of a first normal which is a normal at a center point of the first reflective surface, and
   a second MEMS including a second mirror having a second reflective surface that reflects light from the first mirror toward the window portion and scans light from the first mirror, the second mirror oscillating to form a second plane orthogonal to the first plane with a trajectory of a second normal which is a normal at a center point of the second reflective surface, wherein the light-forming unit further includes
   a plurality of said laser diodes,
   a plurality of filters that multiplex light emitted from the plurality of laser diodes, the plurality of laser diodes include
     a first laser diode that emits first light,
     a second laser diode that emits second light, and
     a third laser diode that emits third light, and the plurality of filters include
   a first member that multiplexes the first light emitted from the first laser diode with the second light emitted from the second laser diode, and
   a second member that multiplexes the first light and the second light multiplexed by the first member with the third light emitted from the third laser diode.

10. The scanning optical module according to claim 9, wherein the first laser diode is a red laser diode that emits red light, the second laser diode is a green laser diode that emits green light, and the third laser diode is a blue laser diode that emits blue light.

* * * * *